United States Patent
McClelland

(10) Patent No.: US 7,336,527 B1
(45) Date of Patent: Feb. 26, 2008

(54) ELECTROMECHANICAL STORAGE DEVICE

(75) Inventor: Gary Miles McClelland, Palo Alto, CA (US)

(73) Assignee: International Business Machines Corporation, Armonk, NY (US)

( * ) Notice: Subject to any disclaimer, the term of this patent is extended or adjusted under 35 U.S.C. 154(b) by 302 days.

(21) Appl. No.: 11/300,709

(22) Filed: Dec. 14, 2005

(51) Int. Cl.
G11C 11/50 (2006.01)

(52) U.S. Cl. .................... 365/164; 365/189.12

(58) Field of Classification Search ........... 257/415, 257/E29.324, E21.613; 362/285; 365/151, 365/164, 244, 240, 78, 189.12; 369/126; 310/10, 13; 438/48, 50, 52; 977/724, 732, 977/940, 943
See application file for complete search history.

(56) References Cited

U.S. PATENT DOCUMENTS

| | | | | |
|---|---|---|---|---|
| 4,381,555 A | 4/1983 | Heinle | | 365/78 |
| 4,736,202 A | 4/1988 | Simpson et al. | | 365/153 |
| 4,979,149 A | 12/1990 | Popovic et al. | | 365/244 |
| 5,677,823 A | 10/1997 | Smith | | 365/234 |
| 5,771,321 A | 6/1998 | Stern | | 385/31 |
| 5,867,302 A | 2/1999 | Fleming | | 359/291 |
| 6,054,745 A | 4/2000 | Nakos et al. | | 257/415 |
| 6,473,361 B1 | 10/2002 | Chen et al. | | 365/244 |
| 6,625,047 B2 * | 9/2003 | Coleman, Jr. | | 365/51 |
| 6,643,165 B2 | 11/2003 | Segal et al. | | 365/151 |
| 7,046,539 B1 * | 5/2006 | Gilkey et al. | | 365/64 |
| 7,095,645 B2 * | 8/2006 | Pinkerton et al. | | 365/151 |
| 2004/0238907 A1 * | 12/2004 | Pinkerton et al. | | 257/419 |

FOREIGN PATENT DOCUMENTS

| | | |
|---|---|---|
| DE | 100 34 315 A1 | 1/2002 |
| WO | WO 2004/108586 A1 | 12/2004 |

OTHER PUBLICATIONS

K. J. Ziegler et al., "Bistable nanoelectromechanical devices", Applied Physics Letters, vol. 84, No. 20, May 17, 2004, pp. 4074-4076.

* cited by examiner

*Primary Examiner*—Richard T. Elms
*Assistant Examiner*—Alexander Sofocleous
(74) *Attorney, Agent, or Firm*—Daniel E. Johnson

(57) ABSTRACT

An electromechanical storage device includes an input element that facilitates the input of data, a series of data elements, and a terminating element that facilitates the reading out of data. The data elements each have at least two stable mechanical orientations, and these orientations can be utilized to store data. Data may be entered into the device by applying a transient electromagnetic pulse to the data elements. The device is constructed such that as a data bit is entered into the series of data elements, any data bits that have been previously entered into the series are shifted towards the terminating element.

25 Claims, 15 Drawing Sheets

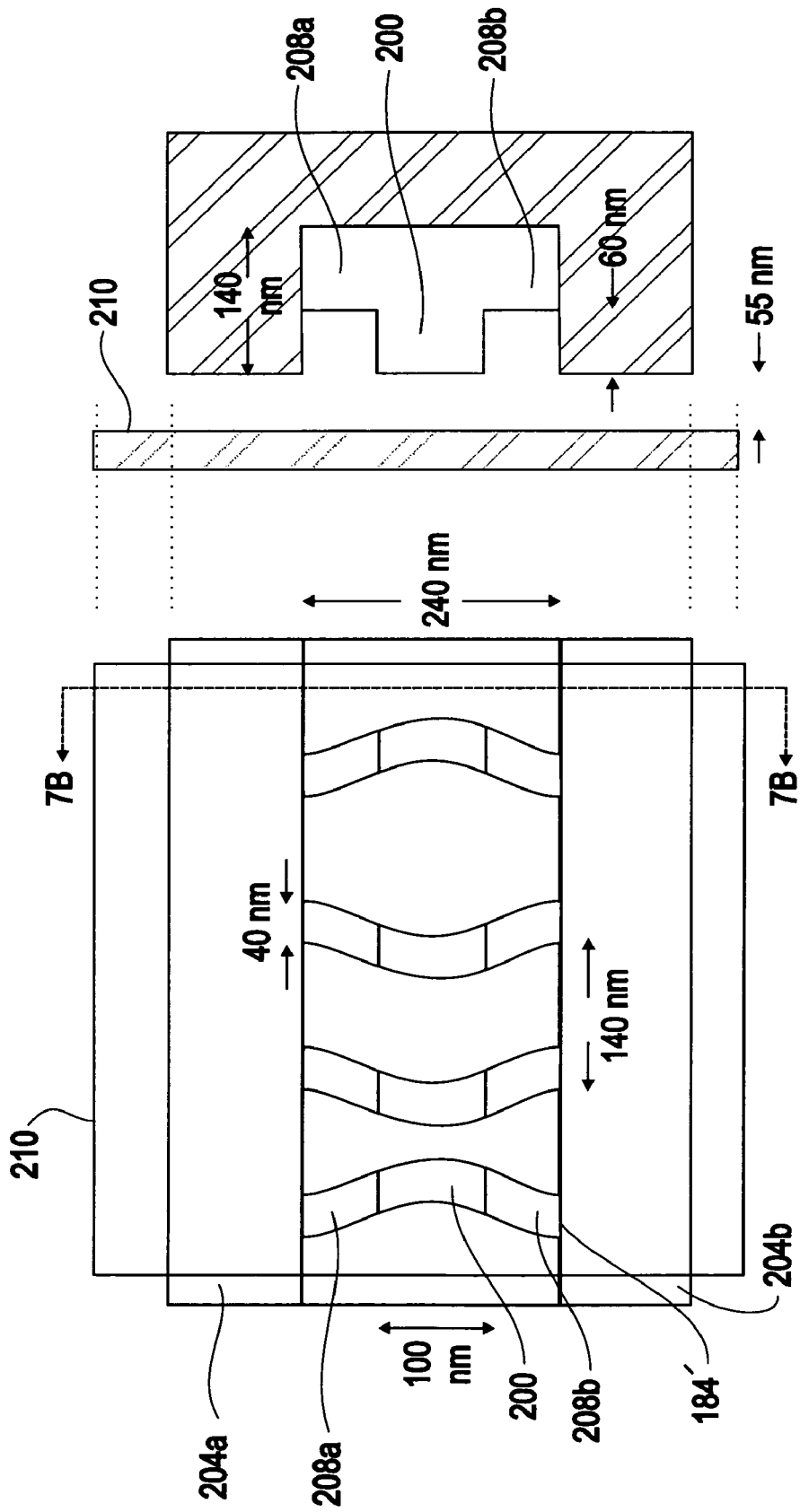

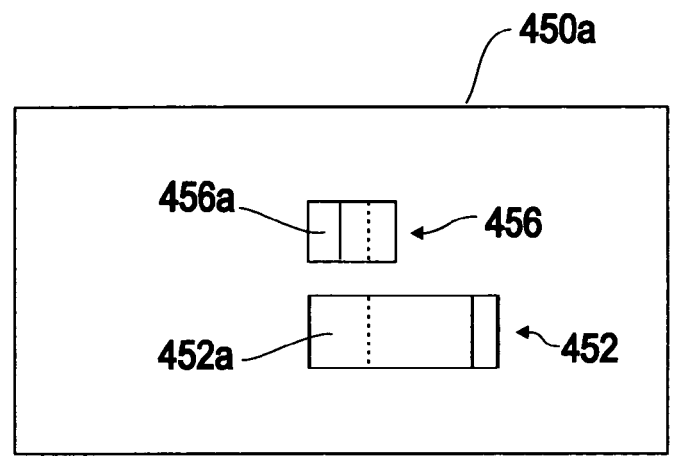
FIG. 10A
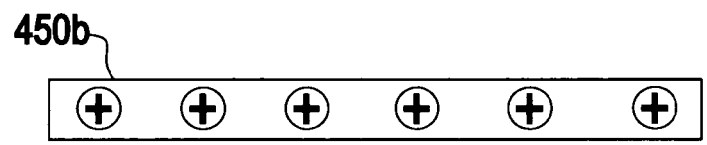
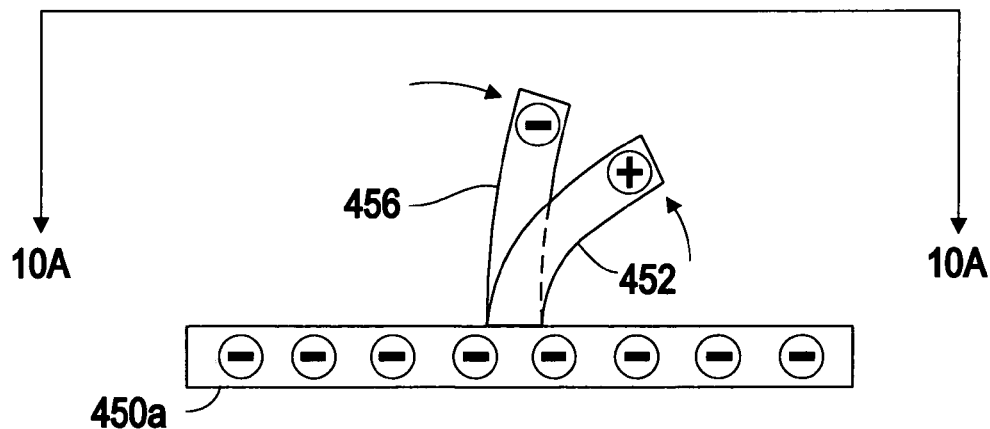
FIG. 10B

Starting position
(Field ↓)

Reverse field
(Field ↑)

Data transferred
to secondaries

Reverse field again
(Field ↓)
Data transferred
to next primary

ELECTROMECHANICAL STORAGE DEVICE

TECHNICAL FIELD

The invention relates to a mechanical data storage device, and more particularly, to a memory shift register in which data bits are stored mechanically but entered into the storage device using electromagnetic means.

BACKGROUND

Hard disk drives are commonly used for data storage in view of their relatively low cost/bit. However, they are subject to crashes, in which the entire disk drive may be wiped out. For this reason alone, it is both complicated and expensive to create reliable storage systems based on disk drive technology. Other problems with disk drives include their large quiescent power consumption and their inability to randomly access data in parallel.

Although many inexpensive solid state storage schemes have been proposed, few show promise for greatly lowering the price of storage below that of flash. Any such devices would probably be made by standard microelectronic manufacturing techniques, and even if layers of storage could be fabricated very cheaply, the achievable reduction in system cost would be modest, because only a limited number of layers can be stacked on an underlying expensive driver chip.

Electromechanical devices have been considered in the past as storage devices, but they tend to be fairly complex, since each cell must be addressed for both writing and reading. These devices generally involve a cross/point array and, if lithography is employed to manufacture them, several masks steps may be necessary to define the array. This then entails considerable vacuum processing. Thus, electromechanical devices have suffered from many of the same limitations that prevent solid state devices from achieving low-cost storage.

What is needed is a memory device that can be constructed inexpensively (e.g., using a roll-to-roll processing technique), and that lends itself to the stacking of many memory layers.

SUMMARY OF THE INVENTION

Preferred embodiments of the invention store information in and retrieve information from an imprintable shift register composed of bistable mechanical data elements. The data elements need to interact only with their neighbors as data are being written or read out. The data elements can be made with a single imprint and no precise overlay and little if any vacuum processing is required, leading to inexpensive memory layers. To achieve low system cost, an integration scheme is disclosed in which large memory layers are attached only at their edges to a base chip.

One embodiment of the invention is a memory shift register that includes an electrically conducting base and a group of at least 8 (or 100, 2500, or more) data elements, each of which has i) a portion fixed to the electrically conducting base and ii) an end portion that is movable, with each of the data elements being reversibly movable between a first mechanically stable configuration and a second mechanically stable configuration. The device includes at least one conducting member in proximity with the data elements, in which in response to an electrical potential being applied between the conducting member and the base, charge builds up in the data elements, so that for any two adjacent data elements having i) different mechanical configurations and ii) respective end portions that are closer to each other than are their respective base portions, the two adjacent data elements mutually repel each other, resulting in each of the two adjacent data elements moving from one stable configuration to another stable configuration. The embodiment also includes an input element located at one end of the group of elements, with the input element facilitating data input into the shift register. In a preferred embodiment, (i) a first type of data bit is represented by a single one of the data elements in a first mechanically stable configuration, and (ii) a second type of data bit (different from the first type) is represented by two adjacent data elements, one of which is in a second mechanically stable configuration (different from the first mechanically stable configuration) and the other of which is in the first mechanically stable configuration. Also, for each of the data elements representing the first type of data bit, its end portion may be advantageously closer to the input element than is its fixed portion. The base and the data elements may be formed from a single piece of material, e.g., they may be formed from molded polymer that is subjected to a swelling process.

A method of using the aforementioned embodiment includes inputting a first data bit into the register by positioning the input element in a predetermined position and then applying an electrical potential between the conducting member and the base, thereby moving at least one of the data elements from a first stable mechanical configuration to a second stable mechanical configuration. This positioning may include bringing an end portion of the input element into proximity with the end portion of a data element. Additional data bits may be input to the register by, for each additional data bit, positioning the input element in a predetermined position and then introducing an electrical pulse to the conducting member, with the first data bit being shifted along the group of data elements and away from the input element. The register may include a terminating element that remains fixed as data are read out of the register (e.g., optically), with the method further including reading out a data bit from the register by determining the mechanical configuration of a data element adjacent to the terminating element. As part of the process of inputting data into the register, an electromagnetic potential between the conducting member and the base may be applied, such that the input member is moved from one stable configuration to another stable configuration while the configuration of the data elements remains unchanged.

Another embodiment of the invention is a data device that includes at least 4 (or 20, 100, 2500 or more) data elements aligned in series, in which each of the data elements is secured to a (preferably conducting) base and is movable (e.g., reversibly movable) between two or more mechanically stable positions. The device further includes at least one component that applies an electromagnetic field simultaneously to all the data elements, wherein in response to the field being applied to all the data elements, at least one of the data elements moves from one mechanically stable position to another mechanically stable position. The device may advantageously include an input element that enters data into the data elements upon application of the electromagnetic field to the data elements, with this input element also being movable between a plurality of mechanically stable positions. The position of this input element may be controlled by a dedicated electrode; alternatively, the input element may be moved between a plurality of mechanically stable positions by an electromagnetic field applied by said at least one component, in which case the applied electromagnetic field does not move any of the data elements to a new mechanically stable position while the position of the input element is being changed. The mechanically stable positions may arise from an inherent elasticity of the data elements (that is not induced by an applied electric field) or these mechanically stable positions may be induced by an applied electric field. The device may further include a terminating element whose position remains fixed as data are read out of the data device, with the input element and the terminating element being located on opposite ends of the series of data elements. In a preferred embodiment, (i) a first type of data bit is represented by a single one of the data elements in a first mechanically stable position, and (ii) a second type of data bit (different from the first type) is represented by two adjacent data elements, one of which is in a second mechanically stable position (different from the first mechanically stable position) and the other of which is in the first mechanically stable position. The data elements themselves may each include both a primary and a secondary data element.

BRIEF DESCRIPTION OF THE DRAWINGS

FIG. 2, which includes

FIG. 3, which includes

FIGS. 6 and 7 are schematics of a memory shift register in which walls of elastomeric material serve as data elements.

FIGS. 8, 9, and 10 illustrate physical principles related to a second memory shift register.

DETAILED DESCRIPTION OF THE INVENTION

Figure 1:
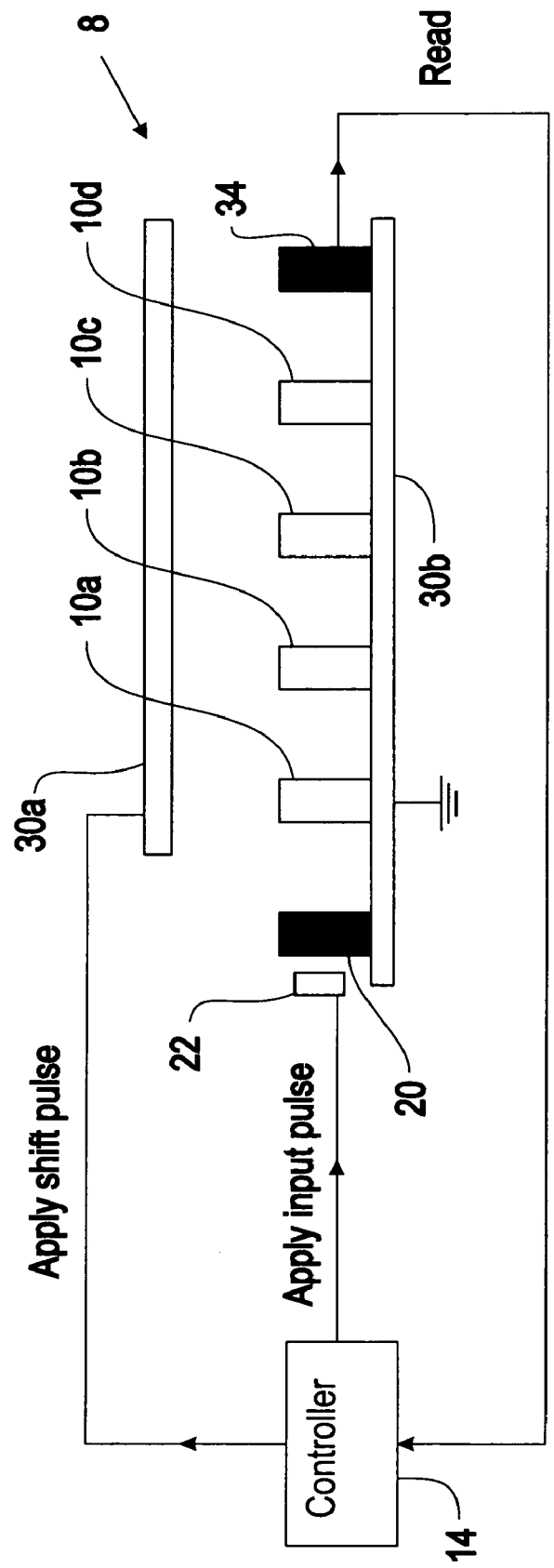
FIG. 1 illustrates certain aspects of a memory shift register, which is shown in cross section.

FIG. 1 illustrates at a high level various working principles of a preferred embodiment of the invention. Data are stored in a series of bistable (or more generally, multistable) data elements $10a$, $10b$, $10c$, $10d$ arranged in series to form a memory shift register 8. Only 4 data elements are shown in FIG. 1 for clarity, although in practice the shift register 8 may include 100, 1000, or even 2500 or more such data elements. Using a controller 14, data are written into one end of the memory shift register 8 through an input element 20 (that may be in communication with an electrode 22 that controls its position through an applied electric field); the data may be read out from the other end of the register using the same controller. The data elements $10a$-$10d$ interact with their neighbors by electrostatic, magnetostatic, mechanical or hydrodynamic forces (or some combination of these) to propagate data synchronously down the register 8. This propagation is actuated by a field or a force (electrical, magnetic, mechanical, or hydrodynamic) that is applied to all the elements rather than specifically addressing just one of them. For example, a magnetic actuating field could interact with either a permanent magnetic dipole on the data elements $10a$-$10d$, or by a dipole generated by the magnetic field in a permeable material.

A preferred approach, however, is to apply an electrical pulse to an activating electrode or electrical component $30a$, with the data elements $10a$-$10d$ being fixed or tied to (e.g., being integrally formed with) an electrical ground or conducting base $30b$. To store data in the shift register 8, the state of the input element 20 is appropriately set, and the desired data bit is then input into the series of data elements $10a$-$10d$, e.g., the data bit may be transferred to the data element $10a$. As additional data bits are input into the shift register 8, previously entered data bits are then shifted down the shift register. During or after each shift step, data are read out of the shift register 8 by sensing the state or orientation of the last data element $10d$ in the series. An output end element or terminating element 34, whose orientation may be advantageously fixed, may assist in reading out the data.

Figure 2A:
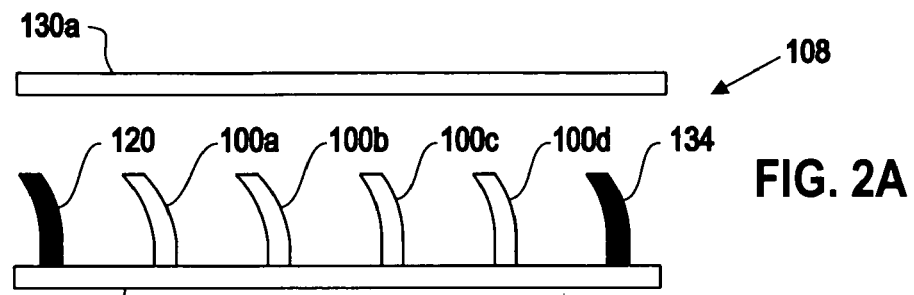
FIGS. 2A, 2B, 2C, 2D, 2E, 2F, 2G, 2H, and 2I, are cross-sectional views of a first memory shift register that illustrate how data can be input into that memory shift register.

These principles are now discussed in greater detail with reference to the preferred embodiment shown in FIGS. 2 and 3. FIG. 2 illustrates how data are input into a memory shift register 108 by focusing on the internal workings of that register in response to an electrical pulse that is applied to an electrical component or activating electrode $130a$. (The controller used to apply a voltage to the electrical component $130a$ is not shown for clarity.) FIG. 2A shows the shift register 108 in an initialized state prior to the input of any data, in which all of a series of bistable data elements $100a$-$100d$ are in a mechanically stable "backward" leaning position that represents a data bit of the type "0". These data elements $100a$-$100d$ are electrically conducting and in electrical communication with an electrical ground or conducting base $130b$. An output end element or terminating element 134 is fixed in a backward position.

Figure 2B:
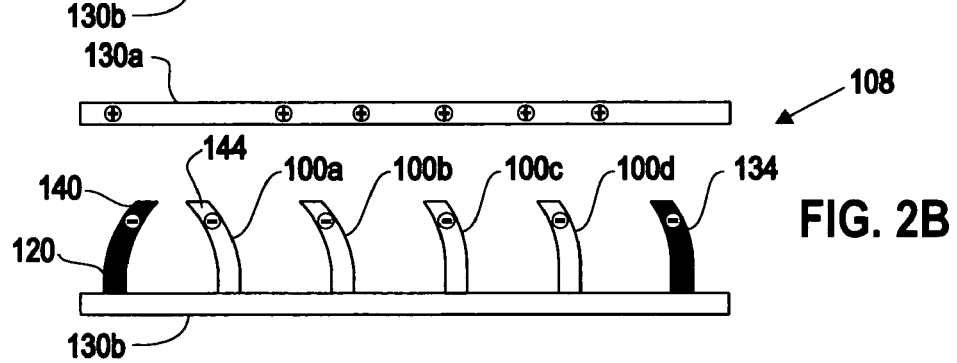
Figure 2C:
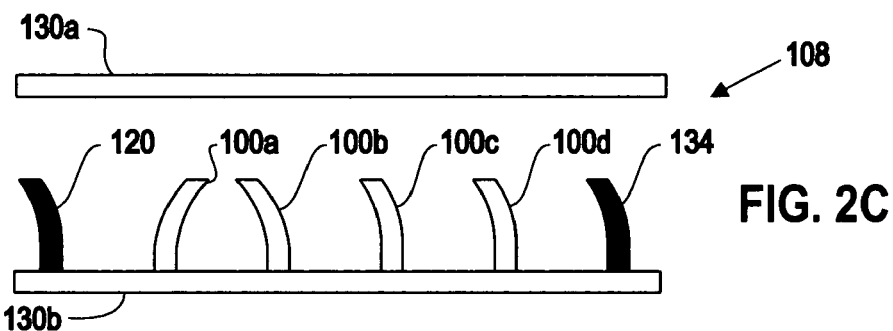
Figure 2D:
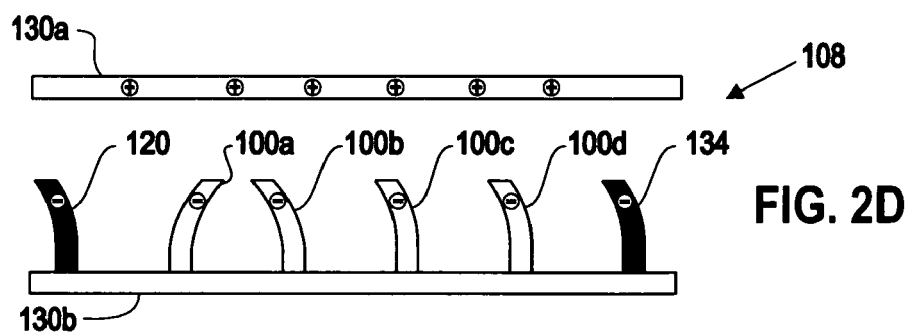
Figure 2E:
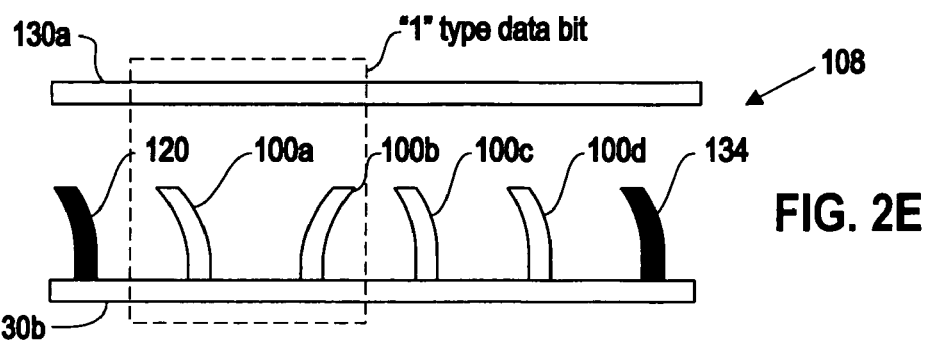

In FIG. 2B, an input element 120 has been positioned forward (with the top of 120 toward the right), either by actuation with a separate electrode positioned nearby or by using a broadcasting method (see below), so that its end portion 140 is in proximity with an end portion 144 of the data element $100a$. To write a data bit of the type "1" (as opposed to a data bit of the type "0", although the nomenclature "1" and "0" may be reversed in this discussion without loss of generality), two different electrical pulses are applied in sequence to the electrical component $130a$. The first of these pulse steps is illustrated in FIGS. 2B and 2C, in which a transient positive voltage potential is applied to the electrical component $130a$, with the end portions 140 and 144 becoming negatively charged as a result of the induced charge migration. (Alternatively, a transient negative voltage can be applied, with the end portions becoming positively charged.) As a consequence, the input element 120 and the data element $100a$ mutually repel each other, leading to the layout shown in FIG. 2C. The input element 120 and the input data element 100a have each moved to a new mechanically stable position as a result of this interaction. Note that the input element 120 is now leaning "backward", and the data element 100a is now leaning "forward", while the data elements 100b-100d continue to lean "backward". The second of the pulse steps used to input a data bit of the type "1" is illustrated in FIGS. 2D and 2E. As shown in FIG. 2D, the electrical component 130a is charged once again. The result is that the data elements 100a and 100b mutually repel each other, leading to the outcome shown in FIG. 2E. This particular combination of a backward leaning data element 100a and a forward leaning data element 100b constitutes, by definition, a data bit of the type "1".

Figure 2F:
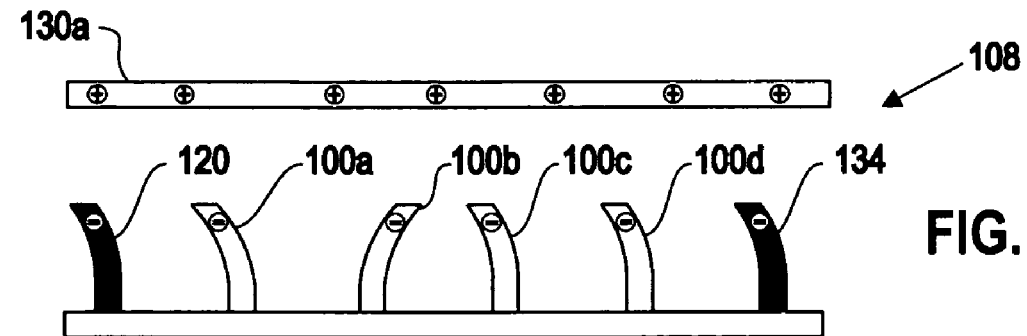
Figure 2G:
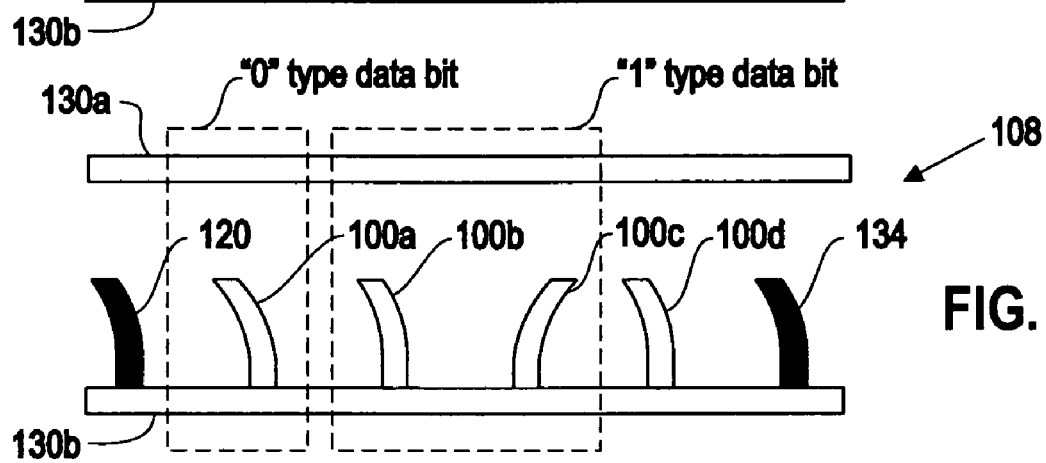

To write an additional data bit, in this case of the type "0", the pulse step illustrated by FIGS. 2F and 2G is used. In this case, the input element 120 is left in its backward position before moving the other data elements. FIG. 2F illustrates the electrical component 130a being charged, so that the data elements 100b and 100c mutually repel each other, leading to the outcome shown in FIG. 2G. In FIG. 2G, the data element 100a represents a data bit of the type "0", whereas the data elements 100b and 100c now represent a data bit of the type "1". A comparison of FIGS. 2G and 2E shows that the "1" data bit has been shifted down the register and away from the input element 120, as a result of the "0" data bit having been introduced into the shift register 108.

Figure 2H:
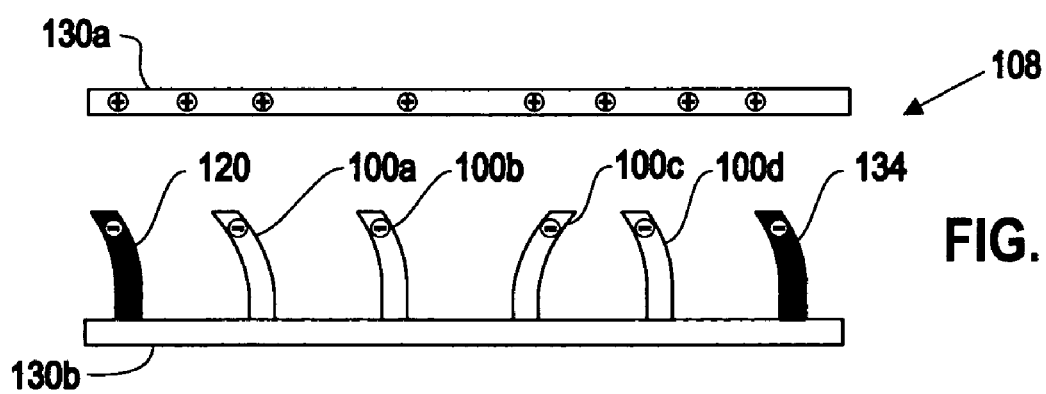
Figure 2I:
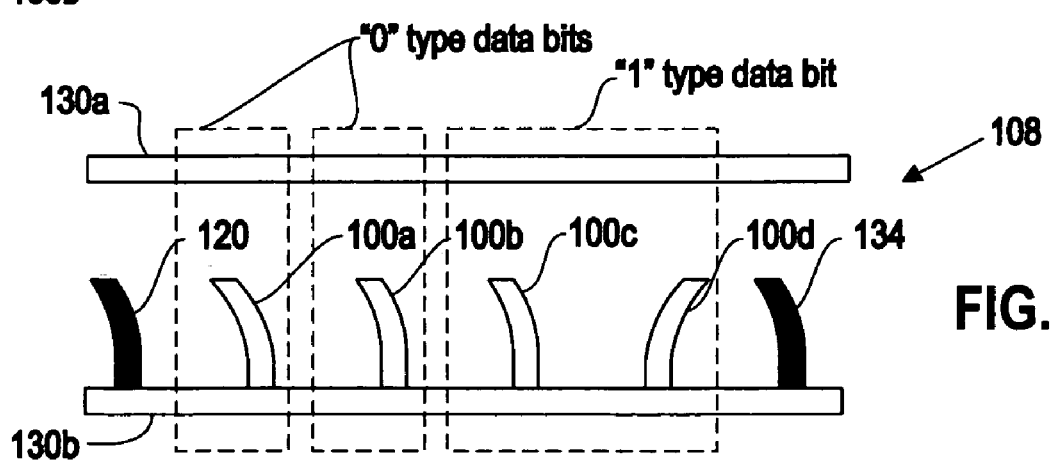

To write yet another data bit of the type "0", the pulse step illustrated by FIGS. 2H and 2I is used. This step is analogous to the one illustrated by FIGS. 2F and 2G, with both the "1" and "0" data bits of FIG. 2G being shifted down the register as a result of the additional "0" bit having been introduced into the shift register 108.

Note that data can be entered into the shift register 108 by appropriately positioning the input element 120 and then applying an electrical pulse to the electrical component 130a, which in turn results in an electrical field being applied to the data elements 100a-100d. Furthermore, applying an electrical pulse to the electrical component 130a has the effect of shifting data bits down the register 108. Preferably, however, no two consecutive data elements 100a-100d are in the forward position, since such a configuration would not facilitate moving the leftward-most of these consecutive forward elements to the backward position upon pulsing.

A related issue is how to make useable a memory shift register having N data elements (e.g., 100a-100d), in which the data elements are initially randomly distributed between the forward and backward positions and include instances of two or more sequential forward leaning data elements. Simulations demonstrate that the shift register will be completely filled with "0" data bits if the shift register is pulsed a few more times than N (e.g., pulsed 2030 times if N=2000), provided the terminating element 134 is in the backward position and "0" data bits are input into the shift register.

Figure 3A:
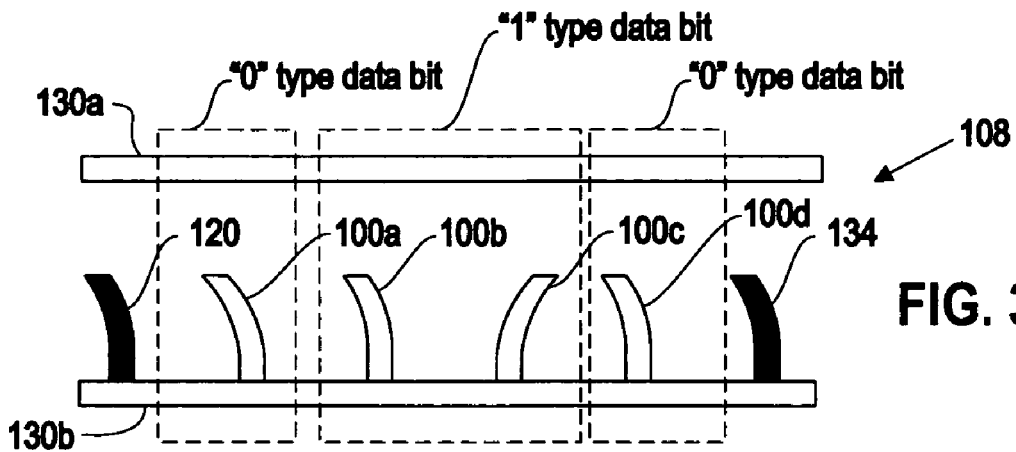
FIGS. 3A, 3B, and 3C, are cross-sectional views of the memory shift register of FIG. 2 that illustrate how data can be read out from that register.

FIG. 3 illustrates how data are read out of the shift register 108 in a sequential fashion, e.g., to the controller 14. FIG. 3A shows how the data elements 100a-100d are configured after the data bit sequence "010" has been entered into the shift register 108. The first data bit to be read out of the shift register 108 is the "0" bit associated with the data element 100d; to this end, this data element's orientation (i.e., whether it is leaning forward or backward) is to be determined. This may accomplished through one of a number of means, as discussed below.

Figure 3B:
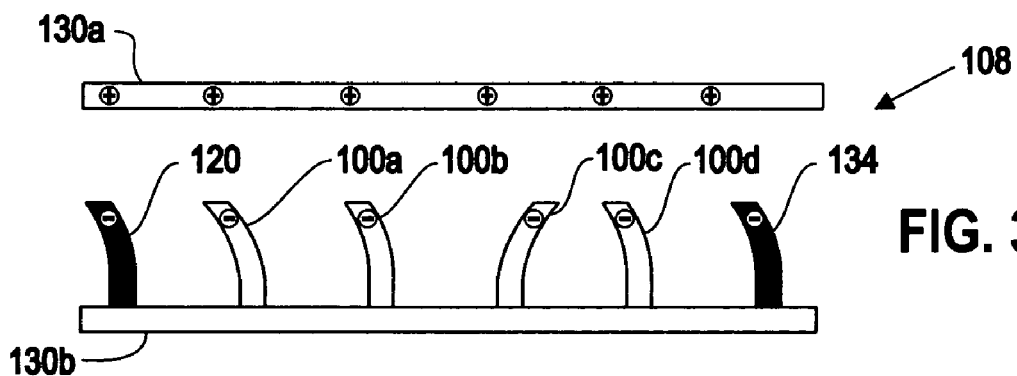
Figure 3C:
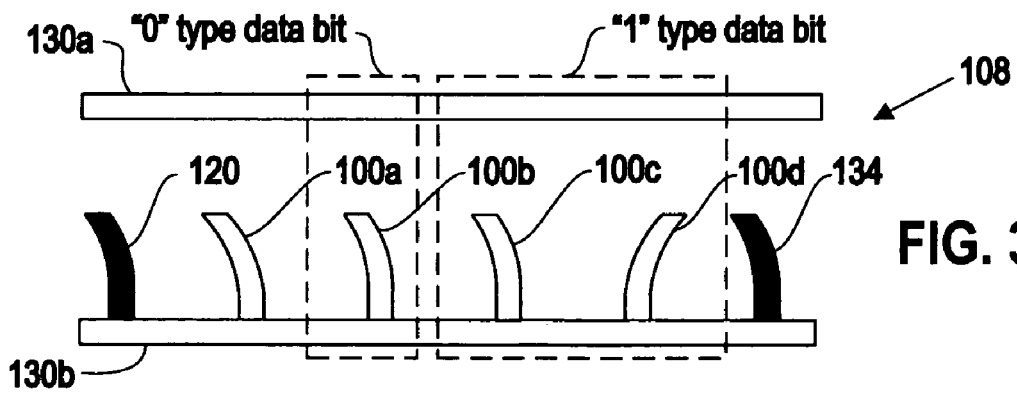

After the orientation of the data element 100d has been determined to be leaning backward, then a voltage potential is applied to the electrical component 130a, as shown in FIG. 3B. This results in the configuration shown in FIG. 3C, in which the "0" and "1" data bits that are still to be read out have been shifted towards a terminating element 134. Next, the orientation of the data element 100d is interrogated again and found to be leaning forward, which is indicative of a "1" data bit, since in this particular embodiment a forward leaning data element is by definition associated with a "1" data bit. Moreover, since a "1" data bit is represented by a forward leaning data bit followed by a backward leaning data bit, it is necessary at this point to apply two consecutive pulses to the electrical component 130a before the next data bit (in this example, a "0" data bit) can be retrieved from shift register 108. Once data have been read out from the shift register 108 as illustrated in FIG. 3, they may be rewritten back into the shift register in accordance with the methodology illustrated in FIG. 2. Note also that data may be input or written into the shift register 108 as data are being read out of the shift register.

In the embodiment of FIGS. 2 and 3, the backward leaning fixed terminating element 134 ensures that the last data element 100d moves properly, even though there is no movable data element to the right of data element 100d. That is, each activating pulse transfers the state of data element 100c to data element 100d.

One way to determine the orientation of the data element 100d is optically. For example, light from a light emitter (not shown) may be directed onto the data element 100d, with the light reflected from this data element being detected by a photodiode or other detector (not shown). The observed reflectance will in general depend on the orientation of the data element 100d, i.e., through proper alignment of the detector and any other optical components, the amount of light incident on the detector can be made to depend strongly on whether the data element 100d is leaning forward or backward. The optical detection element can be fabricated directly into a control circuit of the controller 14. Also, optical collection components can be located at or embedded in either the electrical component 130a or the conducting base 130b, since each of these may be partially or entirely transparent as the conductivity of these surfaces does not necessarily need to be high. In addition, optical resonance effects (which could involve the output end element 134) can be employed to enhance the difference in the amount of light detected when the data element 100d is in the forward and backward positions. If it is useful to situate the light emitter and detector far from the shift register 108, waveguides may be used to carry the light.

Other methods of determining the orientation of the data element 100d may be used as well. For example, if a magnetic film has been deposited on the data element 100d, then a detector (e.g., integrated into a nearby silicon chip) can be used to detect the change in magnitude or direction of the field as the data element 100d moves. Similarly, the orientation of the data element 100d may be determined by measuring its capacitance to a nearby fixed element, for example, element 134.

Figure 4:
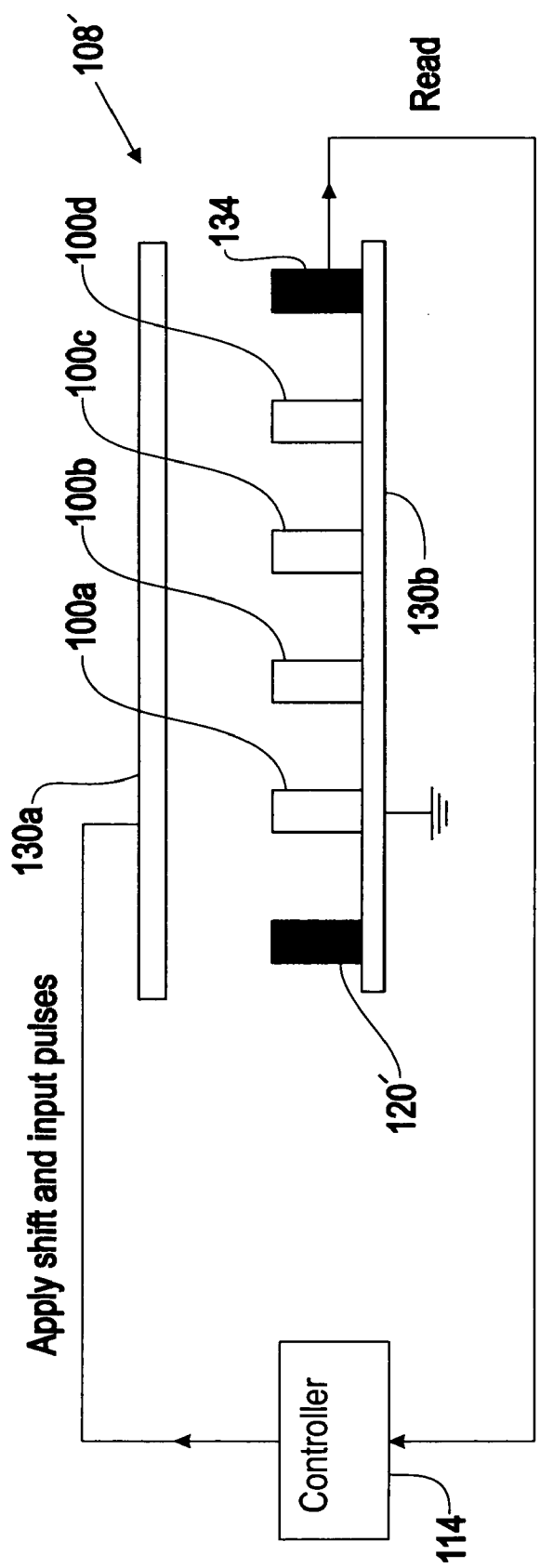
FIG. 4 illustrates a preferred method for inputting data into a memory shift register, which is shown in cross section.

Another way of entering data into a memory shift register is described with respect to FIG. 4, which shows a memory shift register 108' controlled by a controller 114. In this approach, the input element 20 and the electrode 22 are replaced with an input element 120' that functions as a receiving element. The input element 120' is designed to be actuated by the same electrode 130a that is used to apply an electric field to the data elements 100a-100d. For example, the input element 120' may be fabricated with different properties (e.g., its shape may differ from the shape of the data elements 100a-100d), so that it can be addressed separately from the data elements. This can be accomplished by applying at least two different electromagnetic pulses to the electrical component 130a, e.g., pulses having wave shapes that differ in their time dependence and/or magnitude. The input element 120' acts like a receiver for one of the pulses that in turn affects the position of this input element. For example, the input element 120' may be pushed forward towards the data element 100a, with data then being transferred to the data elements 100a-100d as a result of the ensuing interaction between the input element 120' and the data element 100a, in analogy with the process shown in FIG. 2. This broadcasting approach obviates the need for the dedicated line that is connected to the electrode 22 of FIG. 1. It is conceptually similar to broadcasting a radio signal and using a receiver tuned to that signal.

Figure 5A:
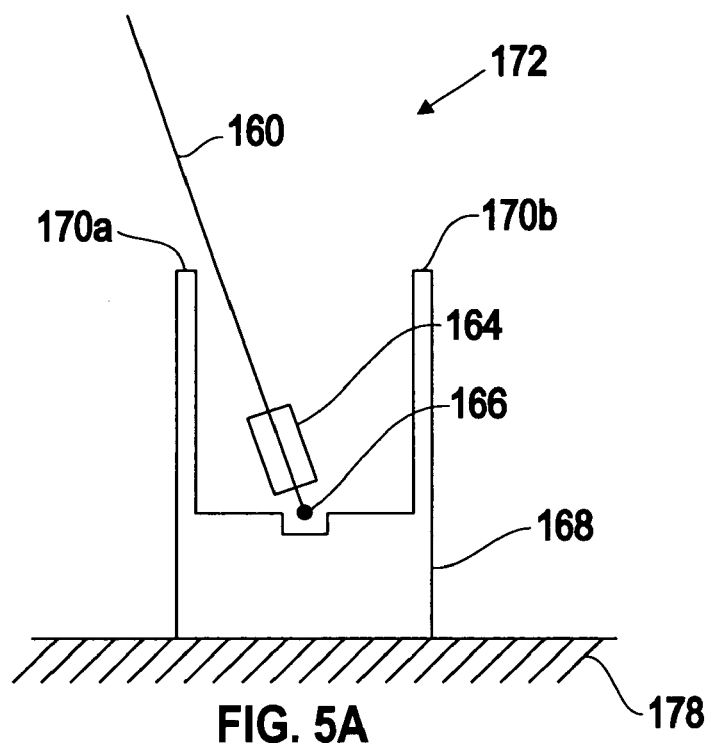
FIG. 5 includes FIGS. 5A and 5B, which are cross-sectional schematics of a macroscopic implementation of a memory shift register based on the principles disclosed herein.

A proof-of-principle experiment was conducted using a series of data elements like the one shown in FIG. 5A. Approximately 5 cm long pieces of paper card 160 coated with conducting graphite were weighted down using a weight 164 such as a 0.25 gm steel shim. Each card 160 was fixed to a pivot point 166 in an aluminum holder 168, which provided two stop points 170a, 170b beyond which the card could not rotate. In this manner, a series of bistable elements 172 were formed.

Figure 5B:
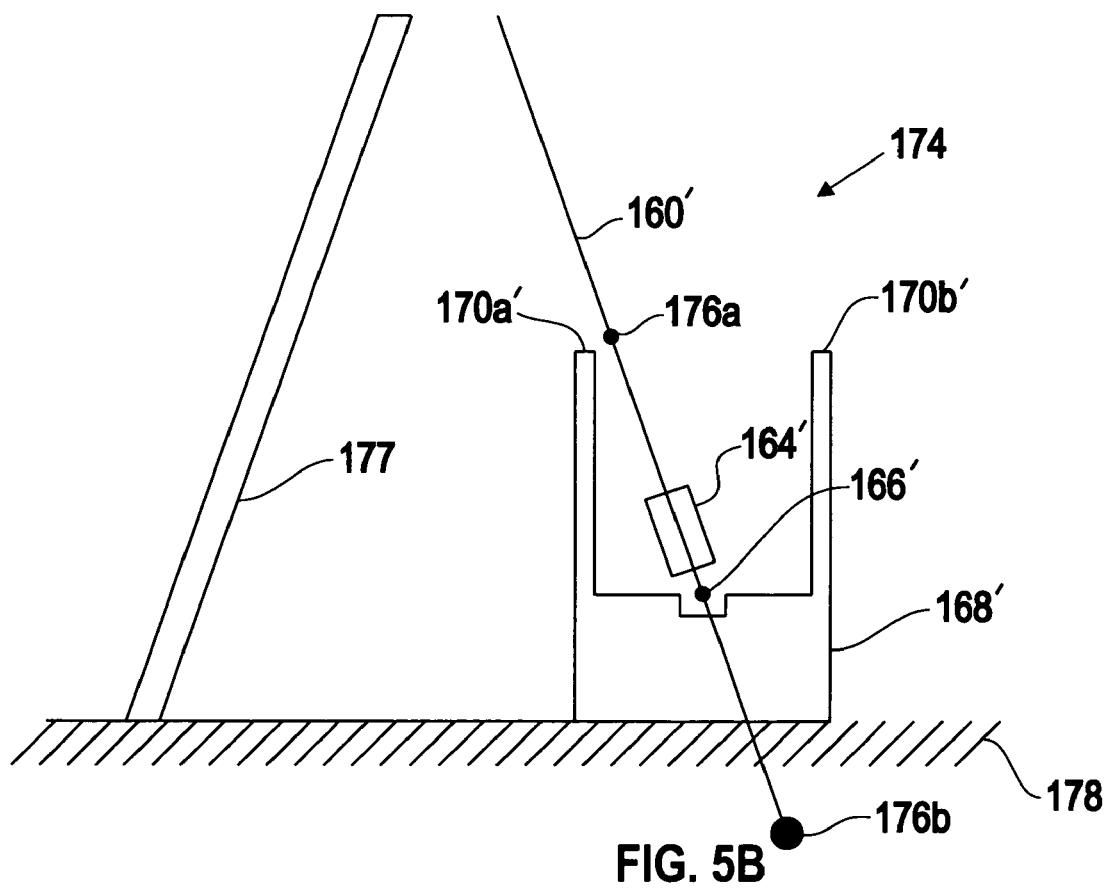

The first of the data elements in this series was replaced with the device shown in FIG. 5B, which provides a way to input data. The right hand side of this device is a bistable element 174 that is identical to the bistable element 172 (and that included a paper card 160', a weight 164', a pivot point 166', an aluminum holder 168', and stop points 170a', 170b', all of which were identical to their unprimed components), except for the addition of two additional weights 176a and 176b that were positioned above and below the pivot point 166', respectively. One purpose of the additional weights 176a and 176b is to increase the moment of inertia of the bistable element 174; another purpose is to reduce the net gravitational torque experienced by this bistable element 174 by carefully balancing the masses of the additional weights 176a and 176b. The left hand side of the device shown in FIG. 5B is a fixed conducting beam 177 having a shape similar to that of the card 160; this beam repels the paper card 160' when 160' is shifted from backward to forward in response to an electrical pulse being applied (see below).

The beam 177, the bistable element 174, and the series of bistable elements 172 all adjoined a conducting base 178 and together formed a simple memory shift register. Instead of a using a planar conducting electrode above the elements, a pulsed potential was applied between the conducting base 178 and a conducting medium which had been applied to the inside of a plastic box that surrounded the shift register. This electrical arrangement generated charge in end portions of the bistable elements 172, 174 (specifically, the end portions of 160, 160') and the beam 177, so that the bistable elements 172 mutually repelled each other as do the data elements 100a-100d, as discussed above in connection with the embodiment shown in FIGS. 2 and 3.

In practice, the bistable elements 172 moved in response to an 8.5 kV, 40 ms pulse being applied, and the bistable element 174 moved in response to a 2.7 kV, 300 ms pulse; note that maintaining a high electric field over macroscopic distances requires a large voltage. The position of the last bistable element 172 in the series was read by a LED/photodiode detector (not shown). A computer (not shown) controlled the register, encoding arbitrary text messages, sending them down the shift register, and then reading them. A shift register of 8 bistable elements 172 was long enough to hold a single encoded letter of the alphabet.

Although the data elements can be constructed as mechanically sliding joints or, as described above, as macroscopic elements rotating about fixed pivots, a preferable approach is to rely on the elastic deformation (e.g., bending or twisting) of the data elements themselves. This allows the mechanical properties of the data elements to be varied by their shape, viscoelastic properties, as well as their drag, if they are immersed in a liquid. One such elastic deformation approach is now described with respect to FIG. 6, which shows a perspective view of a molded elastomeric piece 180 that is made, for example, from PDMS, poly(dimethylsiloxane). The mold (not shown) used to make this piece may be simply a set of closely spaced box-like protrusions, which when pressed into PDMS or another elastomeric material create substantially rectangularly shaped pits 182 separated by thin flexible walls 184. By molding the elastomer onto a rigid base that does not swell and then swelling the elastomer by adding a solvent, the walls 184 are pushed in, thereby leading to the bistable geometry evident from the orientation of the walls 184 in FIG. 6. These walls 184 can be made to function as bistable elements.

Time-dependent molecular dynamic calculations confirm that the molded elastomeric piece 180 can form part of a functioning memory shift register. The elastomeric piece 180 was modeled by a 10 nm period cubic lattice of point masses connected by damped springs to simulate the continuum dynamics. In these calculations, the swelling of the elastomeric piece 180 was modeled directly. In particular, the elastomeric material was viewed as being attached to a rigid frame at a perimeter around the outside of the piece 180, and as the lattice was swelled gradually, the piece 180 reached an equilibrium state. In addition, the shifting of data down the register was also modeled, with the electrostatic force at each of the surfaces of the walls 184 being computed at each time step for the applied voltage; the resulting continuum dynamics of the mechanical system was also computed. The following combination of dimensions produced good operation of a shift register based on the elastomeric piece 180: 1) an electrode (not shown in FIG. 6, but see FIG. 7A) placed 35 nm above the tops of the bistable memory elements or walls 184, 2) a pitch of 138 nm for the walls 184, 3) a length of the walls of 240 nm, 4) a wall height (i.e., the dimension perpendicular to the electrode) of 140 nm, and 5) a wall thickness 40 nm. To achieve bistability, the elastomeric piece 180 was swelled to give a final volume that was 26% larger than its initial volume. With an elastic modulus of $9 \times 10^5$ Pa, a 2.7 Volt, 30 ns long pulse will advance the data elements (i.e., move the walls 184) in 50 ns, for any combination of wall positions that does not include two sequential forward leaning positions.

The dimensional and elastic parameters of the various data elements (represented by the walls 184) should ideally be controlled so that each and every wall 184 moves properly. The extent to which these dimensional and elastic parameters must be controlled is related to the voltage range for which a perfectly manufactured memory will work. A data element should ideally move correctly regardless of the positions of its neighboring data elements. That is, whether it is moved to another bistable position should preferably depend only on whether it and a neighboring data element are pointed toward each other. In practice, the energy $E_F$ supplied by the field to a data element depends on other factors, such as whether it and its adjacent data elements are parallel or pointing away from each other. If the energy supplied by the field to a data element (represented by a given wall 184) is too low compared to its bistability barrier, it will not flip, whereas if it is too high, the attractive force toward the electrode alone can overcome the bistability barrier.

For a perfectly manufactured memory, we define the operating margin as $M=(\Delta V_{op}/V_{op\text{-}average})^2$, which is the range over which data elements can be operated properly for a given mean operating voltage $V_{op\text{-}average}$. Because the energy imparted to a wall 184 by a voltage pulse depends on $V_{op}^2$, M is also the range of energy barriers allowed in manufacturing for a working device at an optimized voltage.

Figure 6:
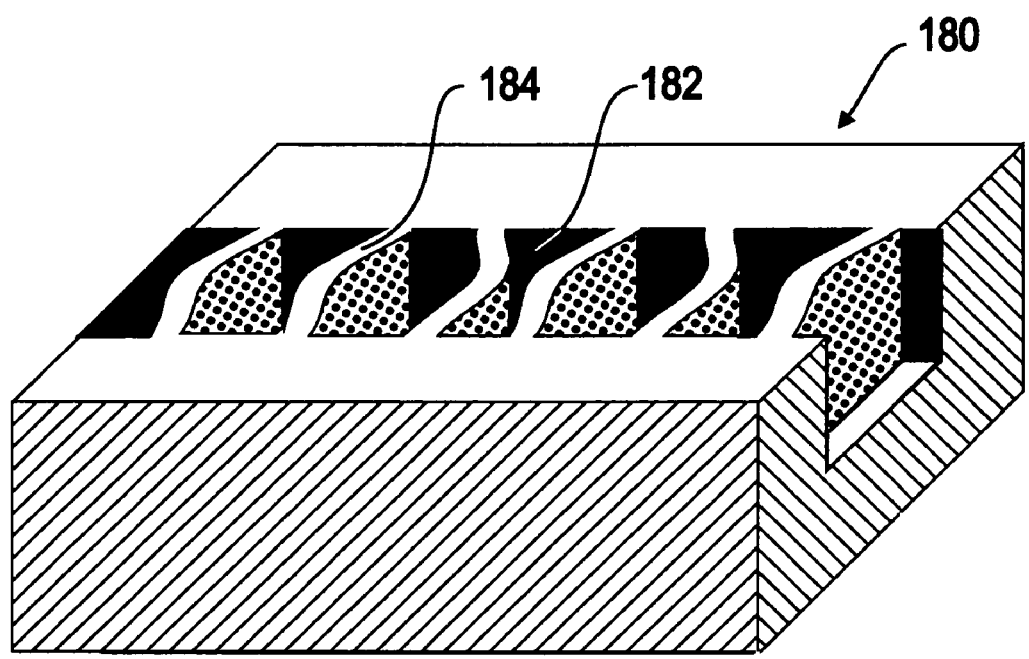

For the design of FIG. 6, the pitch of the walls 184 and the height of these walls were optimized systematically to give the largest operating margin. This led to the geometry described previously, which corresponded to a ±21% operating margin. The operating range can be enhanced over the simple geometry described in the preceding paragraphs by employing the geometry shown in FIG. 7, in which a 100 nm long center portion (denoted by the reference numeral 200) of an elastomeric wall 184' was raised to the height of the surrounding material 204a, 204b. In this case, the adjacent portions 208a, 208b of the wall 184' were vertically recessed by 60 nm. FIG. 7A shows a plan view of this arrangement, including an activating electrode 210, and the corresponding cross sectional view is shown in FIG. 7B. Thus, the walls 184 and 184' can be made to function like the data elements 100a-100d described above. The optimized geometry of FIG. 7 improved the operating margin to ±29% as a result of concentrating induced charge in the center portion 200, where the interaction with the other walls 184 is the strongest.

Figure 8A:
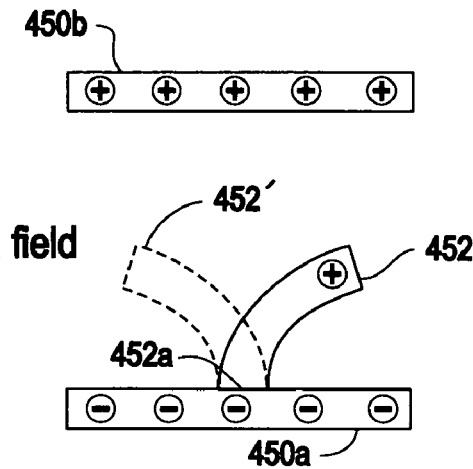
Figure 8B:
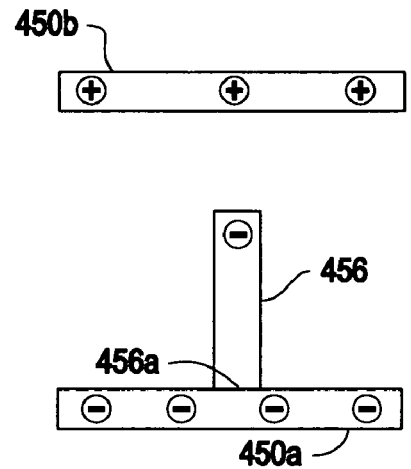

Another embodiment of the invention is now discussed with reference to FIGS. 8-11. This embodiment employs pairs of a primary data element and a secondary data element (which would be referred to by some in the art as a master and a slave, respectively). FIGS. 8 and 9 illustrate the multistable mechanical positions enjoyed by these elements in the presence of an electric field applied by two conducting members or electrodes 450a, 450b. FIG. 8A shows an isolated, positively charged primary data element 452 in one of its mechanically stable positions in the presence of an electric field oriented in the "downward" direction; another of its mechanically stable positions in the presence of this field is shown in phantom and is denoted by the reference numeral 452'. The primary data element 452 is fixed to the conducting member 450a along one of its end portions 452a. As shown in FIG. 8B, in the presence of the same downward oriented electric field, an isolated, negatively charged secondary data element 456 is oriented upright in a mechanically stable position; a portion 456a of the data element 456 is fixed to the conducting member 450a.

Figure 9A:
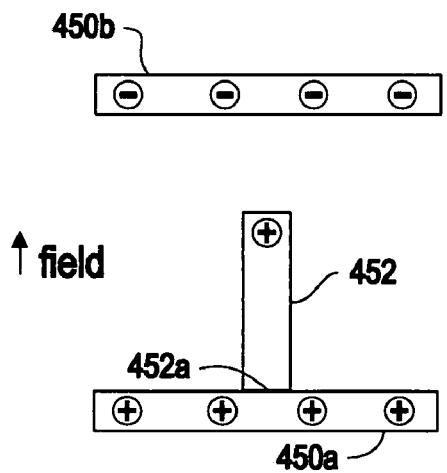
Figure 9B:
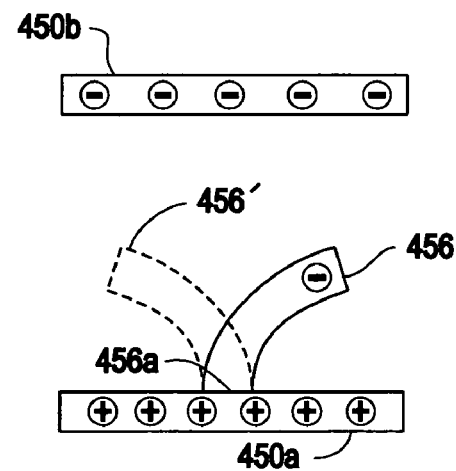

FIGS. 9A and 9B show mechanically stable orientations of the primary and secondary data elements 452 and 456 in the presence of an electric field oriented in the "upward" direction. In this case, the positively charged primary data element 452 is oriented upright in a mechanically stable position, as shown in FIG. 9A. As shown in FIG. 9B, the negatively charged secondary data element 456 enjoys two mechanically stable positions in the presence of the upward oriented electric field, one of which is shown in phantom and is denoted by the reference numeral 456'. Thus, the data elements 452 and 456 enjoy either one or two mechanically stable positions depending upon the orientation of the applied electric field.

The mechanically stable positions of the primary and secondary data elements 452 and 456 when they are in the presence of both an electric field and each other (as shown in FIG. 10) may deviate slightly from the mechanically stable positions of these elements when they are in the presence of an electric field but isolated from each other (as shown in FIGS. 8 and 9). That is to say, having the data elements 452 and 456 in proximity with each other may introduce slight perturbations into their respective mechanically stable positions, as suggested by the arrows in FIG. 10B. The corresponding plan view is shown in FIG. 10A.

FIGS. 11A, 11B, 11C, and 11D show, in sequential fashion, how a "1" data bit can be transferred down a shift register after being input into the device. In each of FIGS. 11A, 11B, 11C, and 11D, "P" and "S" stand for primary and secondary data elements, respectively. The numbers "1", "2", "3", and "4" are associated with respective pairs of primary and secondary elements, with the number indicating the path that the data bit follows as it is transferred from one pair to the next. The "+" and "−" signs serve as a reminder that the primary and secondary data elements are positively and negatively charged, respectively, although the embodiment can also be made to work if the polarities of all the elements are reversed. Also, these plan views give the viewer an indication of the extent to which each of the data elements is deflected from vertical, as each of the data elements has been "projected" into the plane of the conducting member 450a. For example, in FIG. 11A, the data element P1+ is seen to be deflected relatively strongly, whereas the data element S1− is upright. The dotted line denoted by reference numeral 460 is a "propagation axis" that indicates the general direction of the propagation of a data bit through the device. The convention used here is that a primary data element that generally faces towards the propagation axis 460 ("forward") represents a "1" data bit, whereas a primary data element that generally faces away from this axis ("backward") represents a "0" data bit. The data elements P1+, P2+, P3+, P4+, S1−, S2−, S3−, and S4− are preferably immersed in a non-dissociating, high dielectric constant (k) liquid (not shown) that is built in as part of the manufacturing process, so that the Reynolds Number is low. The liquid is used to reduce surface forces and may include DMSO, NMP, or acetonitrile.

Figure 11A:
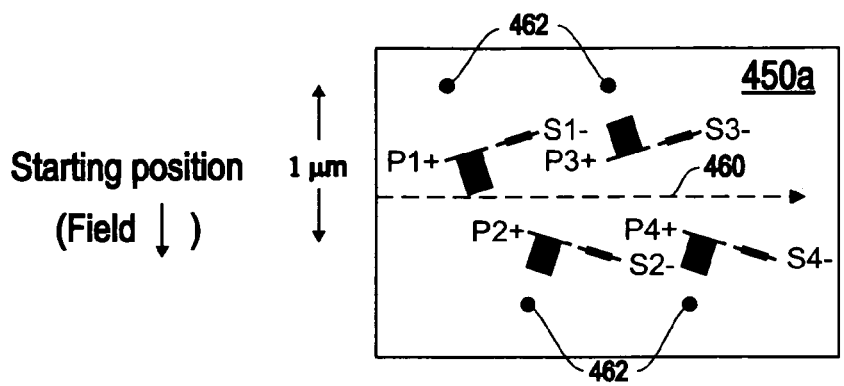
FIG. 11 includes FIGS. 11A, 11B, 11C, and 11D, which are plan views illustrating a second memory shift register.

In FIG. 11A, the electric field is oriented downward, and the device is in its quiescent state, with the downward field pulling each primary data element into one of two bistable positions: forward ("1" data bit) for P1+ and backward ("0" data bit) for P2+, P3+, and P4+. (This data bit can be input using a separate electrode (not shown in FIG. 11) or using a broadcasting method such as that described previously.) Each of the secondary data elements S1−, S2−, S3−, and S4− is pulled upward, nearly perpendicular to the plane of the conducting member 450a.

Figure 11B:
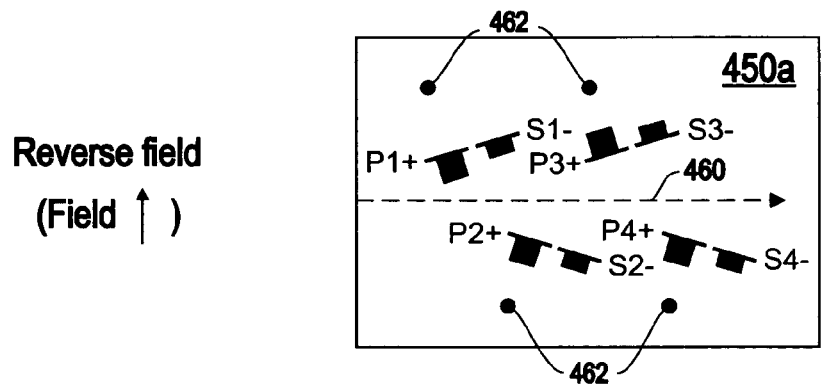

In FIG. 11B, the electric field has now been reversed to the upward direction, which has the effect of "pulling up" the primary data elements P1+, P2+, P3+, and P4+, and pulling down the secondary data elements S1−, S2−, S3−, and S4−. Each secondary data element has moved toward one of two bistable mechanical positions, with this position being determined by the interaction between the secondary data element and its corresponding primary data element.

Figure 11C:
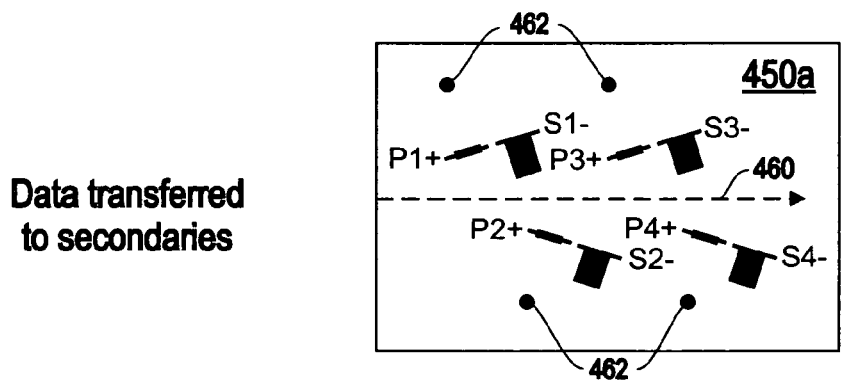

In FIG. 11C, the data elements continue to move in response to the upward oriented applied field. In particular, S1− has moved closer to P2+ (its corresponding "follow-on primary"), whereas S2−, S3−, and S4− have moved further away from their corresponding follow-on primary.

Figure 11D:
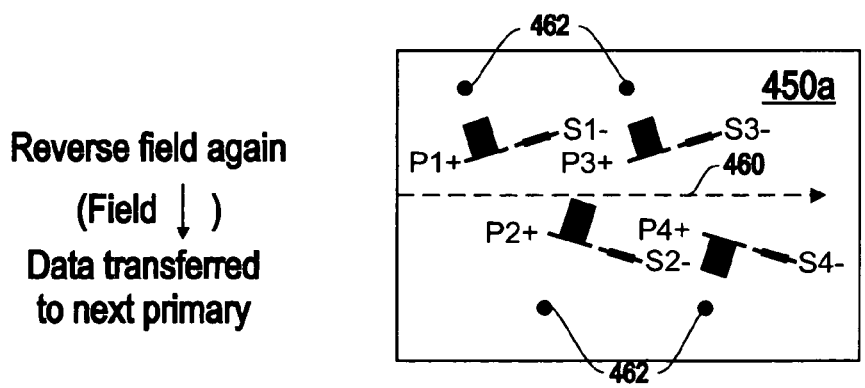

In FIG. 11D, the electric field is reversed again so that it is oriented upward, thereby bringing all the primary data elements P1+, P2+, P3+, and P4+ into bistable positions and uprighting the secondary data elements S1−, S2−, S3−, and S4−. In particular, P2+ experiences the attractive force of S1− (see also FIG. 11C) and is pulled downward into a forward ("1" data bit) position. The other primaries P1+, P3+, and P4+ are constructed by providing nearby charged elements (as discussed in the example below) or by controlling their shape, so that in the absence of a close preceding secondary, they are pulled down and into the backward ("0" data bit) position. In the numerical calculation described below, negatively charged stationary elements or point charges 462 fulfill this role. When the data elements come to the new equilibrium positions shown in FIG. 11D, P2+ is now in the forward ("1" data bit) position, whereas the other primaries are in the backward ("0" data bit) position. By comparing FIGS. 11A and 11D, it can be seen that a "1" data bit has been advanced through the shift register device. The zigzag geometry of FIG. 11 serves a distinct purpose. Since the data flow occurs by attraction of various data elements, data elements arranged in a more linear array would not tend to propagate information forward. By arranging the data element in a 2 dimensional array such as the one shown in FIG. 11, pulling the data element $P_n+$ back toward $S_{n-1}-$ acts to position $P_n+$ to advance information to $S_n-$.

The behavior of the data elements of FIG. 11 is now discussed with respect to certain modeling calculations, in which the data elements (which could be fabricated as flexible polymer beams) are modeled as rigid pivoting beams. In this model, the primary data elements P1+, P2+, P3+, P4+ have a length of 0.52 microns, while the secondary data elements S1−, S2−, S3−, S4− have a length of 0.72 microns, but the width and thickness of the primary and secondary data elements are important to the calculations only to the extent they determine the damping coefficient, which is taken here to be a constant. The relative positions of the elements parallel to the plane of the conducting member 450a can be gleaned from FIG. 11. The primary and secondary data elements were modeled as having respective pivots, with the pivots of the secondary data elements being located in the plane of the conducting member 450a and the pivots of the primary data elements being located above this plane by 0.06 microns; positioning the pivots in this manner was found to optimize the interaction between the primary and secondary data elements.

In addition to the primary and secondary data elements, there are nearby stationary elements 462 (see FIG. 11) assumed to have a point charge of $-1.67 \times 10^{-17}$ C and which are positioned 0.6 microns above the conducting member 450a. Both the primary and secondary data elements are taken to have a point charge at their respective center top edges of magnitude $2.35 \times 10^{-16}$ C.

On the nth data element, a torque $\tau_{1n}$ arises from the electrostatic force exerted on that element from the local field, which is the sum of the applied and built-in fields, including the field from the other primary and secondary data elements, as well as the field from the point charges 462. The externally applied field (which is plotted in FIG. 12) arises from both the potential applied to the electrodes 450a, 450b and the built-in field from surface charges. A second torque $\tau_{2n}$ arises from an elastic restoring force which brings the angle $\theta_n$, which the nth data element makes with vertical, into equilibrium. For angles smaller in magnitude than $\pi/8$, the torque slope $d\tau_{2n}/d\theta_n$ equals $2.50 \times 10^{-15}$ and $1.25 \times 10^{-15}$ N-m/radian for the primary and secondary data elements, respectively. For angles $>\pi/8$, the torque slope doubles to simulate the behavior of a real flexible cantilever fixed to the plane in which the conducting member 450a is located. The negatively charged stationary elements 462 block the primary data elements from tipping out more than 28 degrees from vertical. Because the momenta of the primary and secondary data elements are negligible, the equation of motion of the nth lever is $d\theta_n/dt = (\tau_{1n} + \tau_{2n})/\gamma_n$. The results for the motion of the data elements shown in FIG. 12 were generated by numerically solving this equation using periodic boundary conditions for the plotted external field. The damping coefficient $\gamma_n$ is $4 \times 10^{-22}$ N-m-s/radian for both the primary and secondary data elements, a number estimated to be appropriate for a liquid viscosity of 0.5 cP. The liquid dielectric constant was chosen to be 20.

Figure 12:
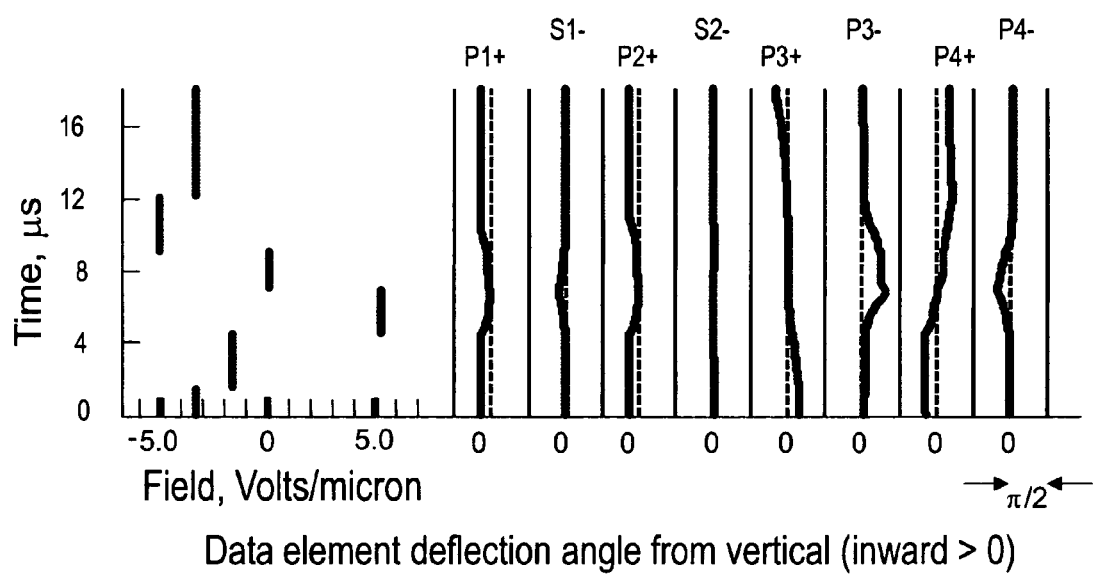
FIG. 12 illustrates how the angle (with respect to vertical) made by the primary and secondary data elements of FIG. 11 vary over time in response to an applied electric field.

FIG. 12 shows the motion of the data elements in the external field plotted at the left side of the figure. The arrows follow the single "1" bit moving from P3+ to S3− and then to P4+. The quiescent built-in field is −3.2 V/μm. The transfer of a "1" data bit from P3+ to S3− occurs when the field is reversed in direction and increased to 5.2 V/μm. Upon this reversal, the primary data elements are pulled up toward vertical, and S3− is attracted by P3+ to tilt inward. Then the external field is switched to zero, allowing P4+ to be attracted by S3−, so that the orientation of P4+ corresponds to the "1" state. Bringing the field down to −5V/μm hastens the return of the system towards the quiescent state, which is stabilized finally by the built-in field to complete the cycle.

Fabricating flexible elements having different polarity and density of electric charge is important to the embodiment shown in FIG. 11. While patterning different regions so that they have different charges could be done by introducing additional lithography steps, this would require precise alignment and greatly increase the manufacturing cost. A preferable solution is to design the memory shift register so that regions having different charges have different heights. In microcontact printing, a topographically patterned stamp with molecular ink patterned on its surface is brought into contact with a flat substrate. Ink is transferred to the flat substrate only where the stamp protrudes. If the ink is instead first applied to the flat substrate, and then the stamp is brought into contact with the substrate, then the ink will be transferred to that layer of the stamp closest to the substrate. Using this principle, a molded memory that included the various data elements P1+, S1−, P2+, S2−, P3+, S3−, P4+, S4− could be contacted with a flat, inked plate in order to preferentially transfer a chemical species only to the topmost surface. Before transferring the ink, the chemistry of this topmost surface would be tailored to immobilize the species to be transferred. The top electrode can also be functionalized with particular chemical species.

By positioning the top conducting member or electrode 450b over the data elements P1+, S1−, P2+, S2−, P3+, S3−, P4+, S4− (which are preferably fixed to the bottom conducting member or electrode 450a), the device can be assembled to include within it (i.e., between the top and bottom conducting members 450a and 450b) a solvent (not shown) of high dielectric constant that does not ionize. The ions entering the solvent from a surface of conducting members 450a, 450b or a surface of the data elements (P1+, S1−, P2+, S2−, P3+, S3−, P4+, S4−) would be attracted at first by any charge remaining on that surface to form a double layer. However, in a suitably high electric field applied by the conducting members 450a, 450b, the ions can be pulled away to another surface. If this other surface is functionalized to bind these mobile ions permanently, the two surfaces will have a permanent charge. When the external potential is removed from the device, a permanent built-in field will remain.

Figure 13:
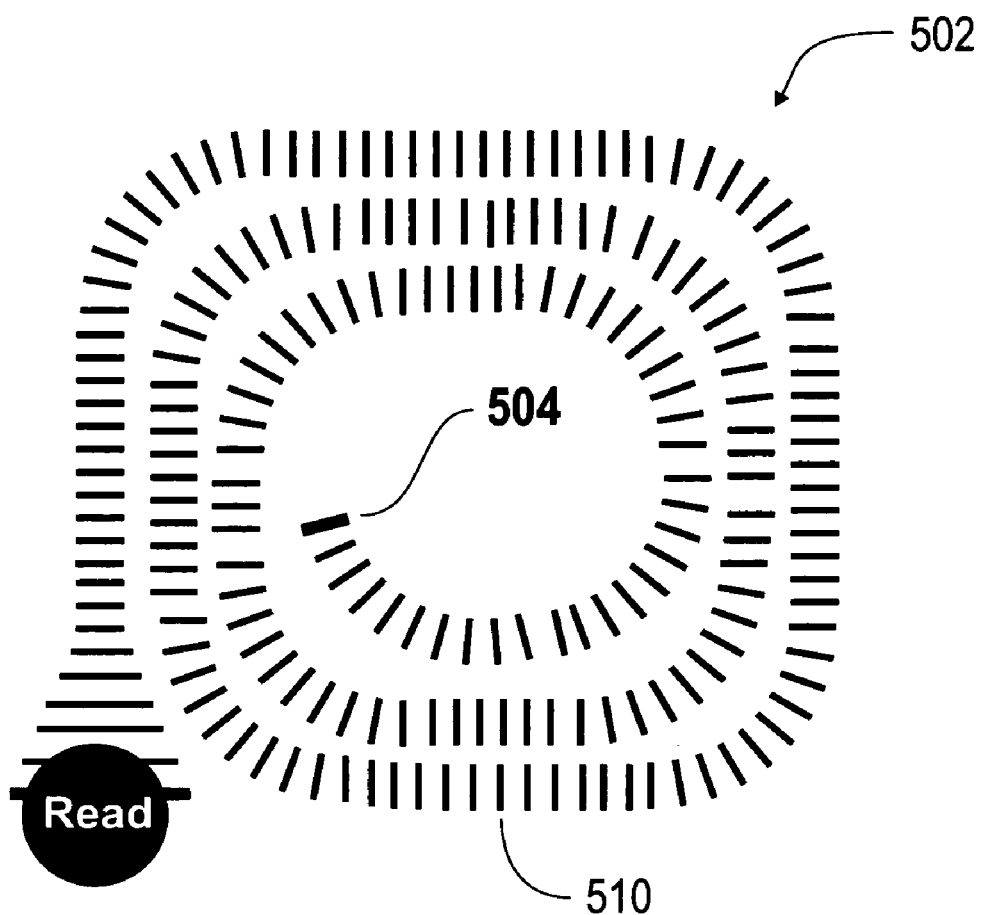
FIG. 13 is a plan view of an embodiment that illustrates how the data elements of a memory shift register can be arranged in a spiral-like shape.

The preferred memory shift register embodiments disclosed herein include data elements arranged in a series. As shown in FIG. 13, the data elements in that series do not necessarily need to be arranged in a row, but rather the series can form a spiral-like shape. In FIG. 13, an input element 504 is positioned at one end of a series of data elements 510 that together form a memory shift register 502. This input element 504 may advantageously function like the input or receiving element 120' described above in connection with FIG. 4, so that the previously described broadcasting method can be used to input data, e.g., with an electrode (not shown in FIG. 13). If a number of shift registers 502 are employed, they may be arranged to form concentric rings (not shown), with one shift register surrounding an adjacent shift register. A concentric geometry allows many shift registers to be packed efficiently at high density, while still retaining a large turning radius. All of the shift registers in such a concentric arrangement could be operated in parallel with a single electrode.

Figure 14A:
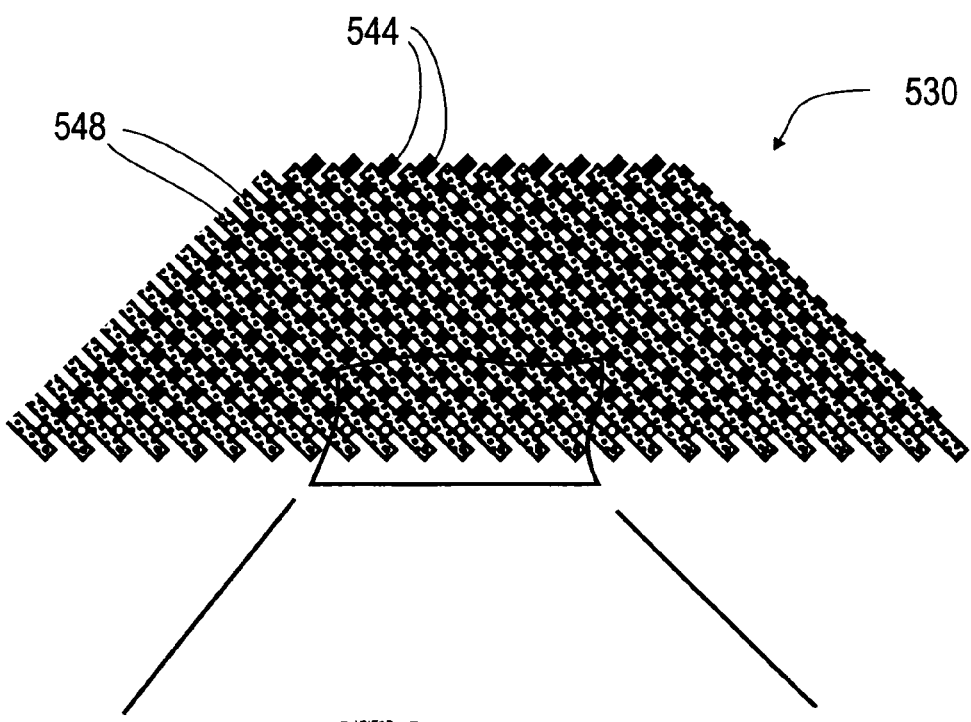
FIG. 14 includes FIGS. 14A and 14B, which show plan views of a crosspoint type device, in which a memory shift register resides at each crosspoint.
Figure 14B:
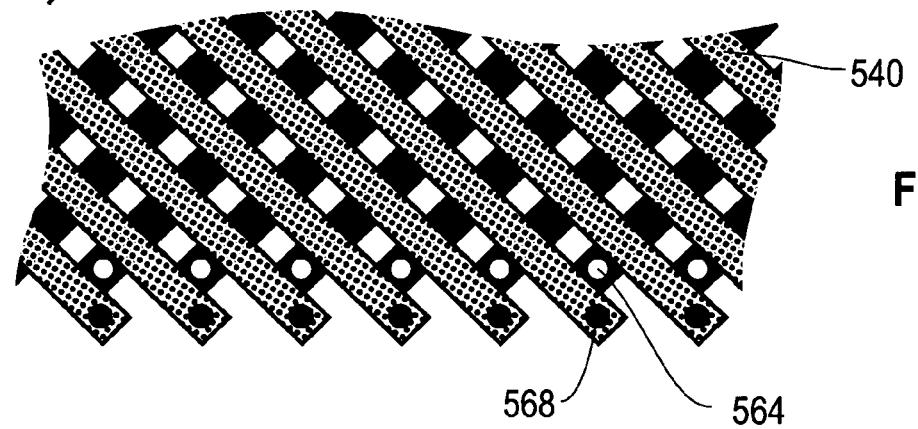

Another way of compactly arranging shift registers is now discussed with respect to the crosspoint-type memory device 530 shown in FIG. 14. At each cross point 540 defined by the groups of bottom lines 544 and top lines 548 (which are offset from each other) a shift register 502 is located (not shown in FIG. 14 for clarity, but see FIG. 13). Note that a series of discrete contacts 564, 568 connect a base chip (not shown) to individual ones of the lines 544 and 548, respectively. This arrangement permits access to the shift registers 502 from just one side of the device 530. The shift register 502 at each cross point 540 or node is accessed by applying electric potential to a unique combination of lines 544 and 548. The fact that some row/column combinations do not correspond to a node can be handled by the system controller (not shown). Thus, the lines 544, 548 and their associated cross points 540 form a memory layer, many of which may be stacked on top of each other, if desired. By offsetting the layers slightly, each layer can be attached directly to an underlying driver chip, in a shingled arrangement.

Figure 15A:
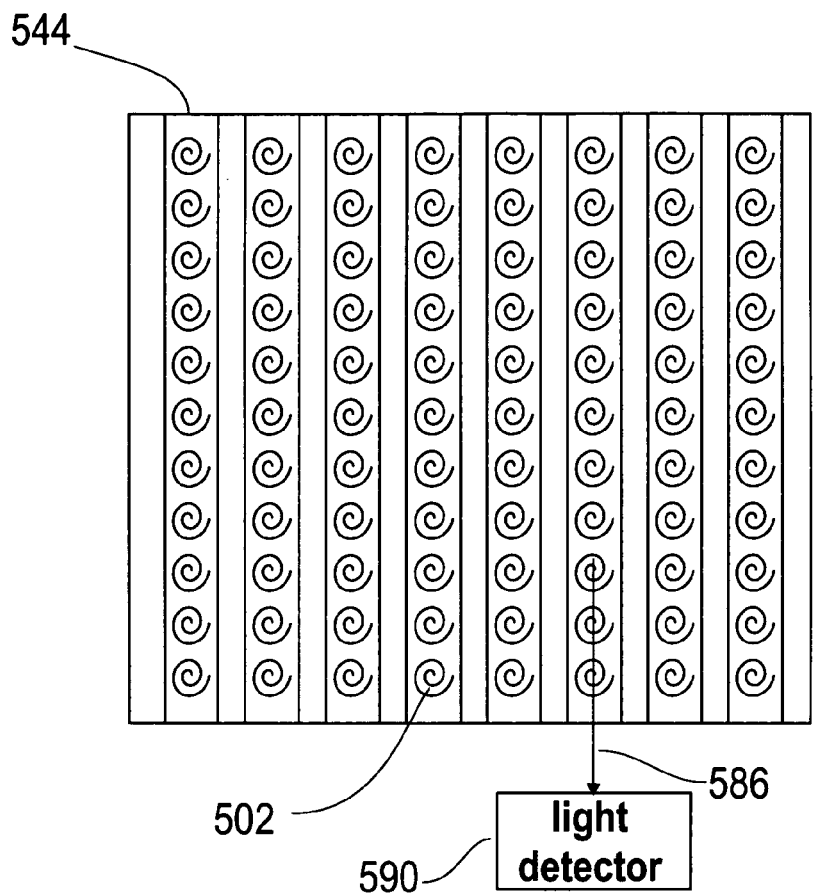
FIG. 15 includes FIGS. 15A and 15B, which illustrate plan and cross-sectional views, respectively, of the embodiment shown in FIG. 14.
Figure 15B:
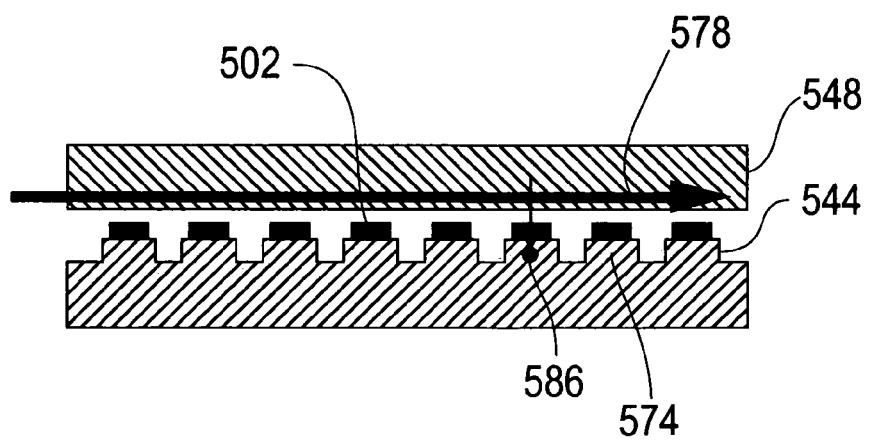

FIG. 15A shows several of the lines 544 (but, in the interest of clarity, without the lines 548). The cross sectional view of the device 530 shown in FIG. 15B illustrates that each of the lines 544 and 548 may advantageously include a parallel waveguide 574 and 578, respectively, which in turn may be in optical communication with a chip (not shown), such as a silicon chip. The shift register 502 may be formed on the surface of the bottom waveguide 574 using the same mold used to generate the lines 544. Also, the waveguides 574 and 578 may advantageously be electrically conducting, so that an electric potential can be applied.

As described above, the orientation of the last data element in the series can be detected optically, so that data stored in the shift register 502 can be read out. Optical detection is enabled by adjusting the spacing between waveguides 574 and 578 and the geometry of the last data element in the shift register 502 (e.g., the data element 100d seen in FIGS. 2 and 3), so that, depending on the position of the last data element in the shift register 502, light 586 is scattered from one waveguide 578 to another waveguide 574. If the data element 510 is about 0.2 microns square, then the shift register 502 would be about 10 microns square assuming the shift register included 2500 such data elements. These dimensions lend themselves to incorporation into a molded waveguide. When such a structure is attached to a controller/driver chip, accurate overlay is not required.

The crosspoint type memory device 530 shown in FIGS. 14 and 15 may include memory shift registers of the type shown in FIGS. 2 and 3 or memory shift registers of the type shown in FIG. 11, or some combination thereof. The various components of the device 530 can be formed by embossing, by UV-cured or thermal imprinting, or by conventional optical lithography. Contact forming methods offer high resolution, low cost, and the ability to form multilevel patterns. Precise in-plane alignment of the various layers may be unnecessary, since adequate alignment can be achieved by imprinting fiducial marks having particular shapes into the layers, with these shapes then assisting in bringing the various layers into their correct in-plane positions as the layers are brought together to form an integrated device.

The driver, detection, control, error correction, and interfacing are preferably performed with other integrated components consisting of microfabricated electronics. Whereas large memory shift registers have the advantage of being able to pack more information per memory layer, small memory shift registers can access information more quickly and are less hindered by defects or localized shifting errors. Before writing data into the memory shift register, the controller (e.g., the controllers 14 of FIG. 1 and 114 of FIG. 4) can map out bad registers, so that they are not used for storing data. An error correction code similar to that used in hard disk drives can be used to correct errors as they arise. Also, the data can be coded so as to be "spread out" between different registers, so that if one register goes bad, the data can be recovered. The controller can be used to keep track of any newly discovered bad registers.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

What is claimed is:

1. A data device, comprising:
   at least 4 data elements aligned in series, wherein each of the data elements is secured to a base and is movable between a plurality of mechanically stable positions; and
   at least one component that applies an electromagnetic field simultaneously to all the data elements, wherein in response to the field being applied to all the data elements, at least one of the data elements moves from one mechanically stable position to another mechanically stable position.

2. The data device of claim 1, including an input element that enters data into said data elements upon application of the electromagnetic field to the data elements.

3. The data device of claim 2, wherein the input element is movable between a plurality of mechanically stable positions.

4. The data device of claim 3, further comprising an electrode that controls the position of the input element.

5. The data device of claim 2, comprising a terminating element whose position remains fixed as data are read out of the data device, the input element and the terminating element being located on opposite ends of the series of data elements.

6. The data device of claim 2, wherein the input element can be moved between a plurality of mechanically stable positions by an electromagnetic field applied by said at least one component, wherein the applied electromagnetic field does not move any of the data elements to a new mechanically stable position.

7. The data device of claim 1, wherein the base is conducting.

8. The data device of claim 1, the data elements being reversibly movable between two mechanically stable positions.

9. The data device of claim 1, in which (i) a first type of data bit is represented by a single one of the data elements in a first mechanically stable position, and (ii) a second type of data bit (different from the first type) is represented by two adjacent data elements, one of which is in a second mechanically stable position (different from the first mechanically stable position) and the other of which is in the first mechanically stable position.

10. The data device of claim 1, the series comprising at least 20 of the data elements.

11. The data device of claim 1, wherein each data element includes both a primary and a secondary data element.

12. The data device of claim 1, wherein the mechanically stable positions are induced by an applied electric field.

13. The data device of claim 1, wherein the mechanically stable positions arise from an inherent elasticity of the data elements that is not induced by an applied electric field.

14. A memory shift register, comprising:
   an electrically conducting base;
   a group of at least 8 data elements, each of which has i) a portion fixed to the electrically conducting base and ii) an end portion that is movable, each of the data elements being reversibly movable between a first mechanically stable configuration and a second mechanically stable configuration;
   at least one conducting member in proximity with the data elements, wherein in response to an electrical potential being applied between the conducting member and the base, charge builds up in the data elements, so that for any two adjacent data elements having i) different mechanical configurations and ii) respective end portions that are closer to each other than are their respective base portions, said two adjacent data elements mutually repel each other, resulting in each of said two adjacent data elements moving from one stable configuration to another stable configuration; and
   an input element located at one end of the group of elements, the input element facilitating data input into the shift register.

15. The shift register of claim 14, wherein (i) a first type of data bit is represented by a single one of the data elements in a first mechanically stable configuration, and (ii) a second type of data bit (different from the first type) is represented by two adjacent data elements, one of which is in a second mechanically stable configuration (different from the first mechanically stable configuration) and the other of which is in the first mechanically stable configuration.

16. The shift register of claim 15, wherein for each of the data elements representing the first type of data bit, its end portion is closer to the input element than is its fixed portion.

17. The shift register of claim 15, wherein the base and data elements are formed from a single piece of material.

18. The shift register of claim 15, wherein the data elements are formed from molded polymer that is subjected to a swelling process.

19. A method of using the shift register of claim 14, comprising:
   inputting a first data bit into the register by positioning the input element in a predetermined position and then applying an electrical potential between the conducting member and the base, thereby moving at least one of the data elements from a first stable mechanical configuration to a second stable mechanical configuration.

20. The method of claim 19, wherein said positioning includes bringing an end portion of the input element into proximity with the end portion of a data element.

21. The method of claim 19, further comprising inputting additional data bits into the register by, for each additional data bit, positioning the input element in a predetermined position and then introducing an electrical pulse to the conducting member, with the first data bit being shifted along the group of data elements and away from the input element.

22. The method of claim 19, wherein the register includes a terminating element that remains fixed as data are read out of the register, the method further comprising reading out a data bit from the register by determining the mechanical configuration of a data element adjacent to the terminating element.

23. The method of claim 19, wherein the register includes at least 100 data elements.

24. The method of claim 19, further comprising applying an electromagnetic potential between the conducting member and the base, such that the input element is moved from one stable configuration to another stable configuration while the configuration of the data elements remains unchanged.

25. The method of claim 19, further comprising reading out data from the register optically.

\* \* \* \* \*